(12) United States Patent
Ho et al.

(10) Patent No.: US 7,223,923 B2
(45) Date of Patent: May 29, 2007

(54) PCB CAPABLE OF RELEASING THERMAL STRESS

(75) Inventors: Shu Lin Ho, Su-Ao Township, Yilan County (TW); Shih Chieh Wang, Hsinchu (TW)

(73) Assignee: Hannstar Display Corporation, Sungshan Chiu, Taipei (TW)

( * ) Notice: Subject to any disclaimer, the term of this patent is extended or adjusted under 35 U.S.C. 154(b) by 156 days.

(21) Appl. No.: 10/973,601

(22) Filed: Oct. 26, 2004

(65) Prior Publication Data

US 2006/0086532 A1  Apr. 27, 2006

(51) Int. Cl.
*H05K 1/03* (2006.01)
(52) U.S. Cl. .................. 174/255; 174/254; 361/809
(58) Field of Classification Search ............... 174/250, 174/254, 255, 260; 361/749–751, 809
See application file for complete search history.

(56) References Cited

U.S. PATENT DOCUMENTS

| 5,043,796 | A  | * | 8/1991 | Lester ........................ 257/717 |
| 5,945,984 | A  | * | 8/1999 | Kuwashiro .................. 345/206 |
| 6,787,895 | B1 | * | 9/2004 | Jarcy et al. ................. 257/698 |
| 2004/0129452 | A1 | * | 7/2004 | Owens ........................ 174/260 |
| 2005/0145413 | A1 | * | 7/2005 | Chang et al. ............... 174/250 |

* cited by examiner

*Primary Examiner*—Jeremy C. Norris
(74) *Attorney, Agent, or Firm*—Hoffmann & Baron, LLP

(57) ABSTRACT

A PCB comprises a slender substrate, a thermal compression area and at least a slit. The thermal compression area, placed on the slender substrate, has a plurality of bonding pads for a plurality of TCPs to be mounted thereon and a plurality of dummy pads placed between the TCPs. The slit transversely crosses the thermal compression area and slices some of the dummy pads. When the TCPs are connected to the bonding pads of the PCB, the thermal compression area is heated to around 150° C. to 200° C. Therefore, the slit can block the thermal expansion to be accumulated along the longitudinal direction of the thermal compression area.

6 Claims, 4 Drawing Sheets

PCB CAPABLE OF RELEASING THERMAL STRESS

BACKGROUND OF THE INVENTION

1. Field of the Invention

The present invention relates to a PCB (printed circuit board) capable of releasing thermal stress, and more particularly, to a PCB or a PWB (printed wiring board) with slits for reducing thermal expansion.

2. Description of the Related Art

Recently, a liquid crystal display panel, a type of flat display, has been widely used as a display for PDAs, laptop computers, TVs, and so on.

As shown in FIG. 1, in a liquid crystal display module adopting the aforesaid liquid crystal display panel, tapes 13 with drive IC chips 14 thereon are used in connecting a liquid crystal display panel 11 and the IC chips 14. Each of TCPs 15 (tape chip carriers), including an IC chip 14 and a tape 13, is connected to either a PWB (printed wiring board) 121 or a PWB 122.

The structure of the PWB 121 gradually changed into a 4-layer board from an early 6-layer board due to reduction in cost. Similarly, the PWB 122 gradually changed from a 4-layer board into a 2-layer board. Unfortunately, the problem of thermal expansion for the PWB 121 or the PWB 122 in dimensions becomes worse than an early one, even though the cost and weight are reduced. The thermal expansion of the PWB 121 or the PWB 122 varies from supplier to supplier no matter whether the circuit layouts are the same, because the materials from various suppliers are different.

Referring to FIG. 2(a), in a thermal compression process, the elongation ΔL of the PWB 121 is in direct proportion to the length L of it, the coefficient of thermal expansion or the temperature increment. The elongation ΔL can be obtained by the following formula:

$$\Delta L = L\alpha(T_1 - T_2)$$

where α is the coefficient of thermal expansion for the PWB 121, $T_1$ is the temperature of thermal compression and $T_2$ is room temperature.

As shown in FIG. 2(b), when ACFs (anisotropic conductive film) are used to connect the input terminals of TCPs 15 and the output terminals of the PWB 121 in a thermal compression process, the connection areas of them are heated to around 150° C. to 200° C. Moreover, the PWB 121, being still hot and expended, is attached to the TCPs 15 which have been already connected and fixed to the liquid crystal display panel 11. Therefore, when the thermal compression process is over and the PWB 121 is cooled down to room temperature, the PWB 121 is bent in accordance with contraction of itself. Consequently, the circuits on the tapes 13 are distorted by the bent PWB 121, and the tapes 13 on the both sides of the PWB 121 are usually damaged due to the distortion.

Now, a PCB or a PWB capable of releasing thermal stress is in high demand because the length of it becomes longer in response to the increment in the size of a liquid crystal display.

SUMMARY OF THE INVENTION

An objective of the present invention is to provide a PCB capable of releasing thermal stress. During a thermal compression process, the thermal expansion of a thermal compression area on the PCB is isolated by a slit. That is, the total elongation of the PCB does not completely relate to the accumulation of thermal expansion along one of its dimension, and the thermal expansion is blocked by the slit.

To achieve the objective, the present invention discloses a PCB capable of releasing thermal stress. The PCB comprises a slender substrate, a thermal compression area and at least a slit. The thermal compression area, placed on the slender substrate, has a plurality of bonding pads for a plurality of TCPs to be mounted thereon and a plurality of dummy pads placed between the TCPs. The slit transversely crosses the thermal compression area and slices some of the dummy pads. When the TCPs are connected to the bonding pads of the PCB, the thermal compression area is heated up around from 150° C. to 200° C. Therefore, the slit can block the thermal expansion to be accumulated along the longitudinal direction of the thermal compression area.

BRIEF DESCRIPTION OF THE DRAWINGS

The invention will be described according to the appended drawings in which.

PREFERRED EMBODIMENT OF THE PRESENT INVENTION

Figure 1:
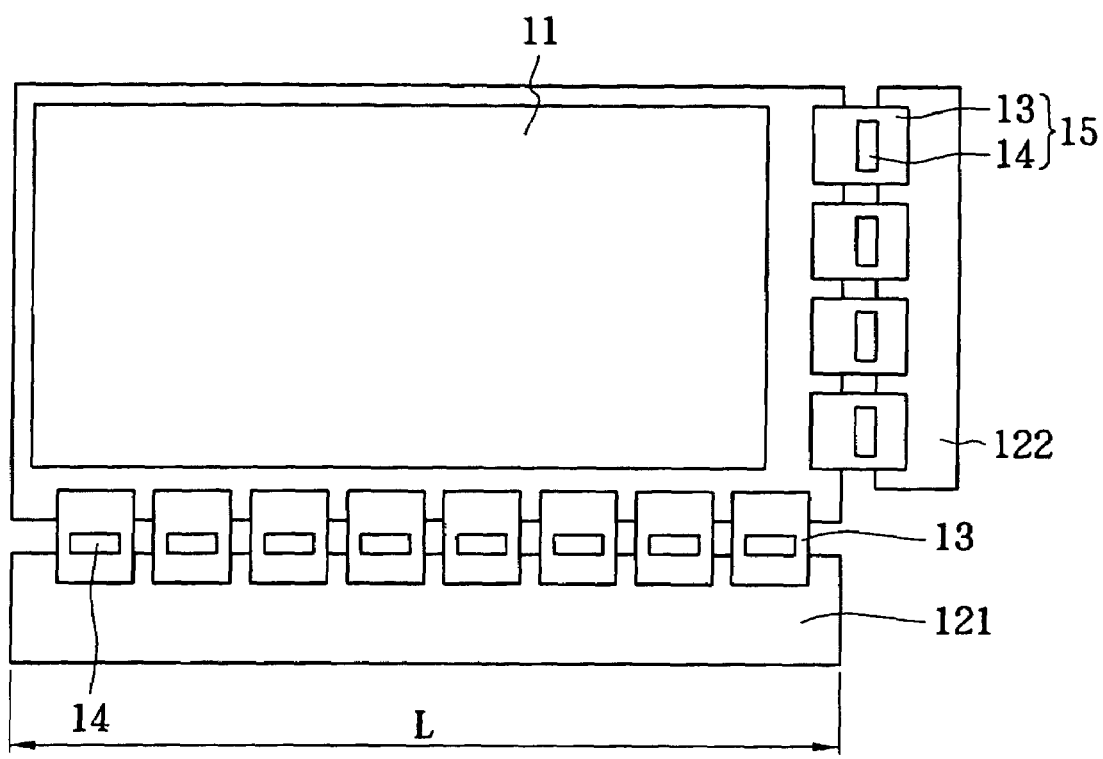
FIG. 1 is a pan view showing a liquid crystal display module including a liquid crystal display panel electrically connected to a conventional PWB through TCPs.
Figure 2A:
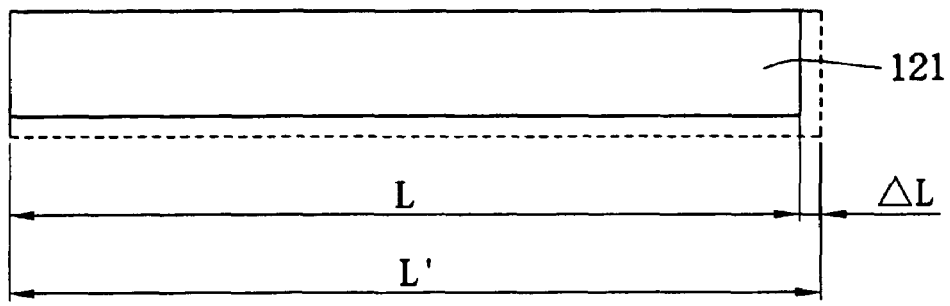
FIG. 2(a) is an explanatory drawings showing the elongation of a PWB during a thermal compression process.
Figure 2B:
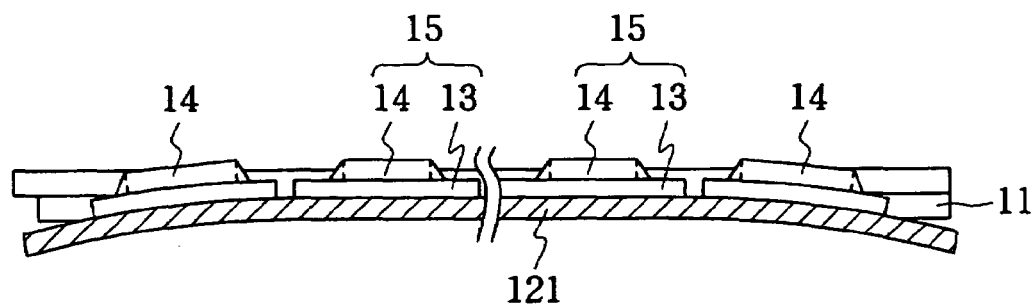
FIG. 2(b) is a side view showing a bent PWB due to the thermal contraction during a thermal compression process.
Figure 3A:
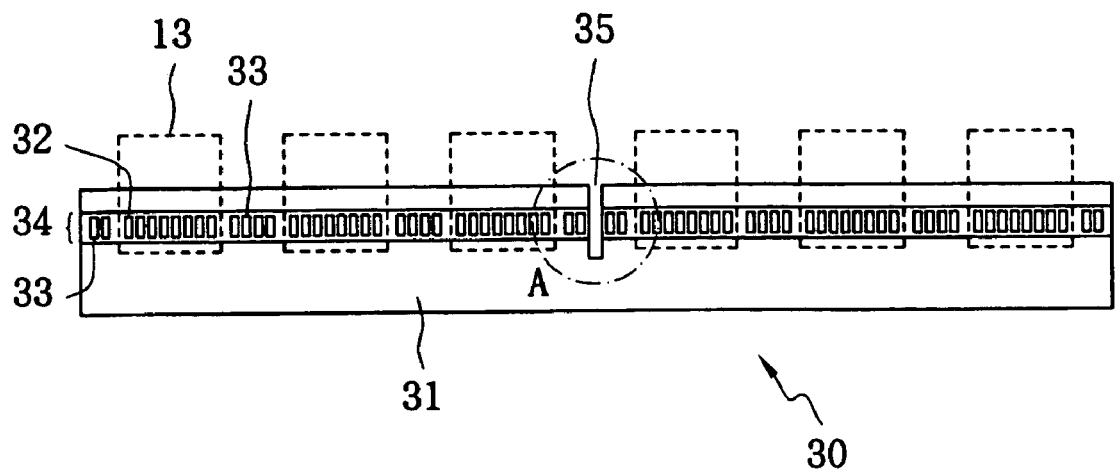
FIG. 3(a) is a schematic diagram of a PWB with a slit in accordance with the present invention.

FIG. 3(a) is a schematic diagram of a PCB with a slit in accordance with the present invention. A PCB 30 comprises a slender substrate 31, a thermal compression area 34 and a slit 35. The thermal compression area 34, placed on the slender substrate 31, has a plurality of bonding pads 32 for the plurality of TCPs 13 to be mounted thereon and a plurality of dummy pads 33 placed between the TCPs 13. The slit 35 transversely crosses the thermal compression area 35 and slices some of the dummy pads 32. When the TCPs 13 are connected to the bonding pads 32 of the PCB 30, the thermal compression area 34 is heated to around 150° C. to 200° C. Therefore, the slit 35 can block the thermal expansion to be accumulated along the longitudinal direction of the thermal compression area 34. In comparison with the prior art in FIG. 1, the total elongation of the PCB 30 is half the total elongation of the PWB 121.

Figure 3B:
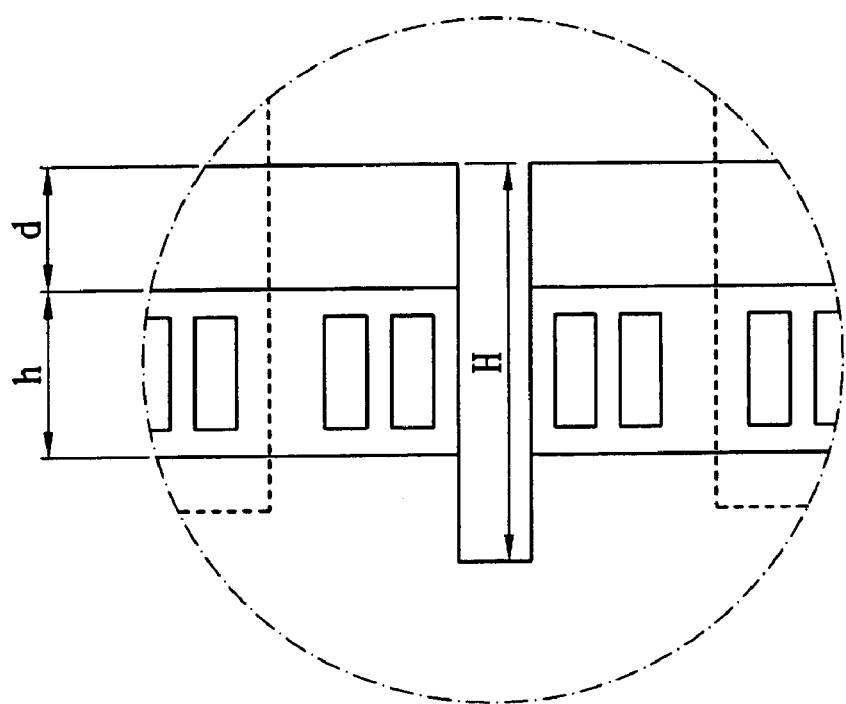
FIG. 3(b) is a partial enlarged view of FIG. 3(a)

As shown in FIG. 3(b), the slit 35 is from the edge adjacent to the bonding pads across to the thermal compression area 35. It is preferred that the length H of the slit 35 is larger than the width h of the thermal compression area 35 so that the thermal contraction is independent between the left and right portions of the thermal compression area 35. Therefore, we can obtain the following:

$$H > h + d$$

where d is the distance between the edge and the thermal compression area 35. In some applications, d is zero, that is, H>h.

Figure 4:
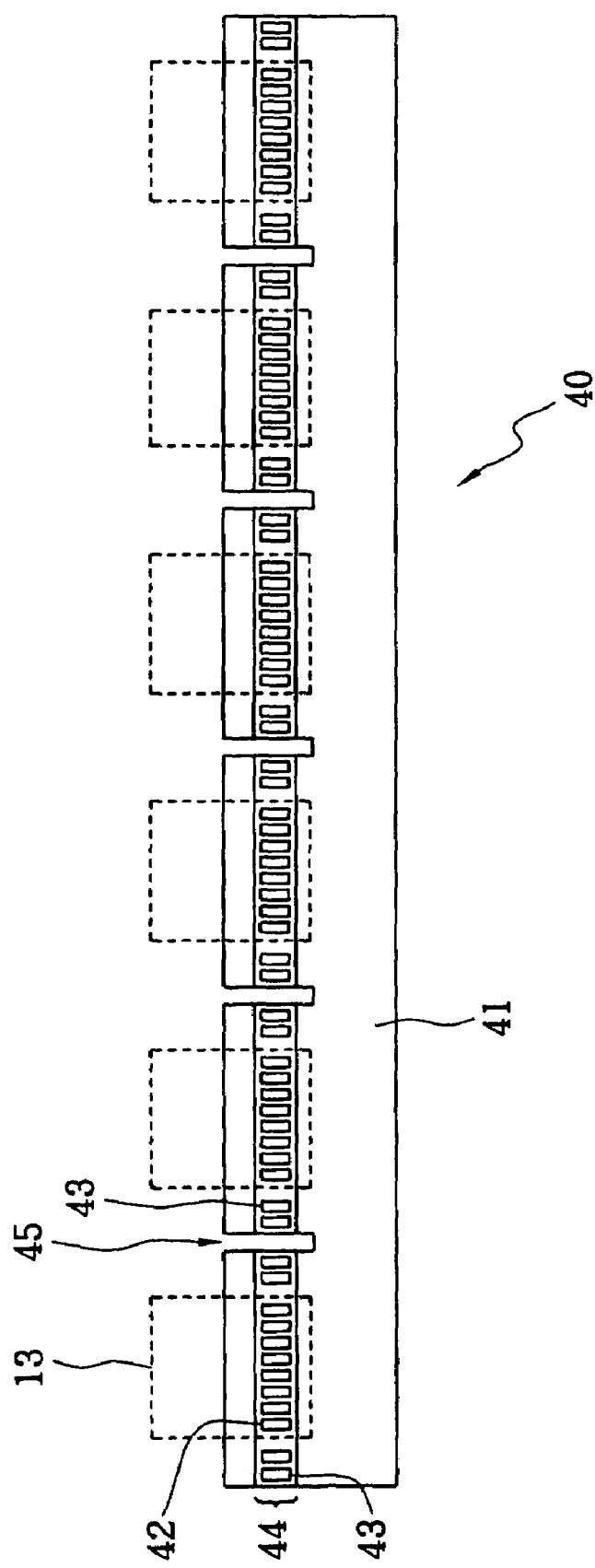
FIG. 4 is a schematic diagram of a PWB with a plurality of slits in accordance with the present invention.

FIG. 4 is a schematic diagram of a PCB with a plurality of the slits in accordance with the present invention. Similarly, a PCB 40 comprises a slender substrate 41 such as a multilayer board including a 4-layers board and 2-layers board, a thermal compression area 44 and a plurality of slits 45. If the PCB 41 is for six TCPs 13 to mounted thereon, it is preferred that the number of the slits is five. That is, at least a slit is on a side of each group of the bonding pads 42. The thermal compression area 44, placed on the slender substrate 41, has the plurality of bonding pads 42 for the plurality of TCPs 13 to be mounted thereon and a plurality of dummy pads 43 placed between the TCPs 13. The slit 45 transversely crosses the thermal compression area 45 and slices some of the dummy pads 42. When the TCPs 13 are connected to the bonding pads 42 of the PCB 30, the thermal compression area 44 is heated to around 150° C. to 200° C. Therefore, the slits 45 can block the thermal expansion to be accumulated along the longitudinal direction of the thermal compression area 44. In comparison with the prior art in FIG. 1, the total elongation of the PCB 40 is one fifth of the total elongation of the PWB 121. Apparently, if a PCB has N slits, the elongation of the PCB is one Nth of the total elongation of the PWB 121 under the same environment condition.

The above-described embodiments of the present invention are intended to be illustrative only. Numerous alternative embodiments may be devised by persons skilled in the art without departing from the scope of the following claims.

What is claimed is:

1. A PCB capable of releasing thermal stress, comprising:
   a slender substrate;
   a thermal compression area placed on the slender substrate and including a plurality of groups of bonding pads;
   a plurality of groups of dummy pads placed on the slender substrate between the bonding pads; and
   at least one slit transversely crossing the thermal compression area between two of the groups of the bonding pads, the at least one slit comprising an open side, wherein the slit slices at least one of the dummy pads.

2. The PCB capable of releasing thermal stress of claim 1, wherein the slit is at the middle of the thermal compression area.

3. The PCB capable of releasing thermal stress of claim 1, wherein the slender substrate is a multilayer board.

4. The PCB capable of releasing thermal stress of claim 1, wherein the number of slits is less than the number of the groups of the bonding pads by one.

5. The PCB capable of releasing thermal stress of claim 1, wherein the slit can block the thermal expansion to be accumulated along a longitudinal direction of the thermal compression area.

6. The PCB capable of releasing thermal stress of claim 1, wherein the slit has a slit length, the thermal compression area has a width, and the slit length is larger than the width.

* * * * *